United States Patent [19]
Ngo

[11] Patent Number: 5,856,891
[45] Date of Patent: Jan. 5, 1999

[54] MR RESISTIVE-BIASING SCHEME PROVIDING LOW NOISE HIGH COMMON-MODE REJECTION AND HIGH SUPPLY REJECTION

[75] Inventor: Tuan V. Ngo, Eden Prairie, Minn.

[73] Assignee: VTC Inc., Bloomington, Minn.

[21] Appl. No.: 786,269

[22] Filed: Jan. 22, 1997

[51] Int. Cl.$^6$ ........................................ G11B 5/03
[52] U.S. Cl. .......................... 360/66; 360/67; 330/258
[58] Field of Search ........................... 360/66, 67, 68; 330/267, 258, 124 R, 295

[56] References Cited

U.S. PATENT DOCUMENTS

| | | | |
|---|---|---|---|
| 3,618,119 | 11/1971 | Rodriguez | 346/74 M |
| 4,706,138 | 11/1987 | Jove et al. | 360/67 |
| 4,712,144 | 12/1987 | Klaassen | 360/67 |
| 4,786,993 | 11/1988 | Jove et al. | 360/67 |
| 4,833,559 | 5/1989 | Belk | 360/113 |
| 5,296,975 | 3/1994 | Contreras et al. | 360/46 |
| 5,309,294 | 5/1994 | Cahalan | 360/66 |
| 5,309,295 | 5/1994 | Bailey et al. | 360/66 |
| 5,363,249 | 11/1994 | Fitzmorris | 360/46 |
| 5,386,328 | 1/1995 | Chiou et al. | 360/68 |
| 5,390,053 | 2/1995 | Averill | 360/46 |
| 5,402,064 | 3/1995 | Eck et al. | 324/207.21 |
| 5,452,148 | 9/1995 | Kawai et al. | 360/67 |
| 5,694,081 | 12/1997 | Fiori, Jr. | 330/69 |

*Primary Examiner*—A. Psitos
*Assistant Examiner*—Dan I. Davidson
*Attorney, Agent, or Firm*—Kinney & Lange, P.A.

[57] ABSTRACT

The present invention is a system for reading information stored on a plurality of disk surfaces. The system comprises a plurality of channels each containing a preamplifier having first and second terminals for connection to an MR head. A bias circuit is provided common to all of the plurality of channels. The preamplifier in each channel includes first and second channel select circuits responsive to first and second channel select signals and current output from the bias circuit to output currents based on the current's output from the bias circuit. The preamplifier in each channel also includes first and second complementary output transistor circuits responsive to the current's output from the first and second channel select circuits and to the first and second voltages to provide bias current through the respective MR head connected between the first and second terminals of the respective channel. The system is entirely symmetrical around ground for improved common mode rejection. In another aspect of the system, first and second supply rejection circuits are provided to stabilize voltages at the first and second terminals for variations in the positive and negative power supplies.

32 Claims, 1 Drawing Sheet

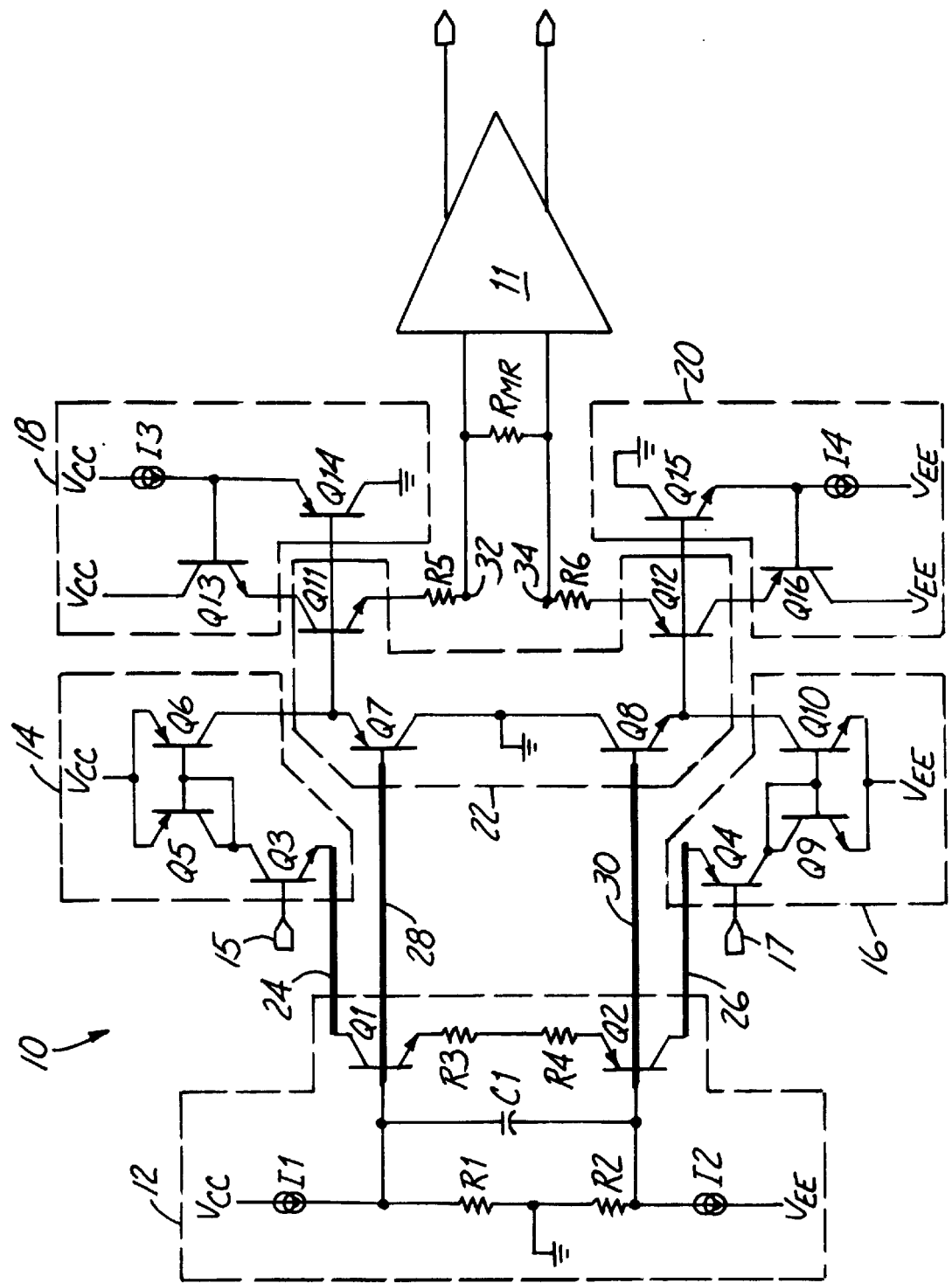

MR RESISTIVE-BIASING SCHEME PROVIDING LOW NOISE HIGH COMMON-MODE REJECTION AND HIGH SUPPLY REJECTION

BACKGROUND OF THE INVENTION

The present invention relates to a preamplifier that provides a bias or driving current for an MR head, and more particularly to an open loop biasing circuit for an MR head providing improved common mode rejection, improved power supply rejection, and lower noise.

The electronic storage of data has become a universally accepted and utilized technology in various computer-related industries. A popular method of electronic storage utilizes magnetoresistive (MR) heads to store and recover data on a disk. An MR head employs an MR element that changes in resistivity with changing magnetic flux from data patterns on an adjacent disk surface. Multiple MR heads are employed in separate channels in systems where data is stored on a plurality of disk surfaces. A bias current having a constant value is passed through the MR element, and the change in resistivity is measured by sensing the change in voltage across the MR head. MR heads are extremely sensitive to noise introduced to it from its bias current source. Precise control of the operation of the MR head is necessary to minimize potential errors in storing and recovering data. Preamplifier circuits have traditionally been designed for that purpose.

Design of MR head circuits also has the competing constraint of limited head space to implement preamplifier circuitry. The limited space makes it desirable to share circuits among several MR head channels on an actuator arm or E-block whenever possible. Thus, each individual MR head channel occupies minimal space by not individually including the shared circuitry. The challenge in designing such a system is to share circuitry while preserving the precise operation of each MR head channel to minimize storage and recovery errors. considerations. A good common mode rejection ratio can be achieved by matching the impedances at each terminal of the MR head. A good power supply rejection ratio is provided when the MR head performs consistently despite fluctuations in the power supply of the MR head circuit.

Preamplifiers have taken a variety of forms to attempt to address these performance issues. Circuits have been designed to bias the MR head to control the current therethrough. In one form, a feedback loop adjusts the MR head bias to provide more precise control over the bias current. However, symmetry (and thus common mode rejection) cannot be optimally achieved in a feedback loop configuration. Other circuits have been designed to allow multiplexing of an off-chip capacitor to a plurality of MR head circuits. However, no solution has been developed to allow significant sharing of components by multiple MR head channels, to achieve optimum space implementation, while also providing superior performance characteristics such as good common mode rejection ratio, good power supply rejection ratio, and low noise.

SUMMARY OF THE INVENTION

The present invention is a system for reading information stored on a plurality of disk surfaces. The system includes a plurality of channels each containing a preamplifier. The preamplifier in each channel has first and second terminals for connection to an MR head. A bias circuit common to all of the channels is included. The bias circuit and preamplifiers are connected to positive and negative power supplies. The bias circuit is symmetrically arranged around ground to provide first and second currents having equal magnitudes and opposite directions and first and second voltages having equal amplitudes and opposite polarities. The preamplifier in each channel includes first and second channel select circuits arranged symmetrically around ground to each other. The first and second channel select circuits respond to respective channel select signals and current received from the bias circuit to output a current. The preamplifier in each channel also includes first and second complementary output transistor circuits arranged symmetrically around ground to each other. The first and second complementary output transistor circuits are responsive to currents output from the respective channel select circuits and the first and second voltages provided by the bias circuit to provide bias current to the first and second terminals based on the currents output from the respective channel select circuits and the first and second voltages.

In another form of the invention, the system further includes first and second power supply rejection circuits arranged symmetrically around ground to each other. The first power supply rejection circuit is connected to the first output transistor circuit to stabilize a voltage at the first terminal for variations in the positive power supply. The second power supply rejection circuit is connected to the second output transistor circuit to stabilize a voltage at the second terminal for variations in the negative power supply.

In yet another form of the invention, a first resistor is connected between the first terminal and the first output transistor circuit, and a second resistor is connected between the second terminal and the second output transistor circuit. The first resistor has a resistance equal to a resistance of the second resistor and greater than a resistance of the MR head. Thus, the MR head is biased near ground potential and symmetrically around ground.

Another aspect of the present invention is a circuit for deriving a bias current for selected ones of a plurality of channels. Each channel includes first and second terminals for connection to a respective MR head. The circuit exhibits equal impedances at the first and second terminals, and is connected to positive and negative power supplies. The circuit includes a bias means for providing first and second currents having equal magnitudes and opposite directions and first and second voltages having equal amplitudes and opposite polarities. The first and second currents and the first and second voltages are symmetrical around ground. The circuit also includes a plurality of first channel select circuits, each responsive to a respective first channel select signal and to the first current to output a current based on the first current. The circuit further includes a plurality of second channel select circuits, each arranged symmetrically around ground to a respective first channel select circuit and each responsive to a respective second channel select signal and to the second current to output a current based on the second current. The circuit additionally includes a plurality of output circuits. Each output circuit has a first and second complementary output transistor circuit. The second output transistor circuit is symmetrical around ground to the first output transistor circuit. The first output transistor circuit is responsive to the current output from a respective first channel select circuit and the first voltage to provide a first bias current to a respective first terminal. The second output transistor circuit is responsive to the current output from a respective second channel select circuit and the second voltage to provide a second bias current to a respective second terminal. The first and second bias currents are based on the currents output from the respective first and second channel select circuits and the first and second voltages.

In one form of the invention, the first current is provided on a first current bus, the second current is provided on a second current bus, the first voltage is provided on a first voltage bus, and the second voltage is provided on a second voltage bus.

A further aspect of the invention is a system for reading information stored on a disk surface. The system includes first and second terminals for connection to an MR head. The system is connected to positive and negative power supplies. A preamplifying circuit is provided in the system. The preamplifying circuit includes an open-loop bias circuit providing first and second currents having equal magnitudes and opposite directions and first and second voltages having equal amplitudes and opposite polarities. The first and second currents and the first and second voltages are symmetrical around ground. The preamplifying circuit also includes first and second complementary output transistor circuits. The second output transistor circuit is symmetrical around ground to the first output transistor circuit. The first output transistor circuit is responsive to the first current and the first voltage to provide a first bias current to the first terminal. The second output transistor circuit is responsive to the second current and the second voltage to provide a second bias current to the second terminal. The first and second bias currents are based on the first and second currents and the first and second voltages. The preamplifying circuit further includes first and second supply rejection circuits. The second supply rejection circuit is symmetrical around ground to the first supply rejection circuit. The first supply rejection circuit is connected to the first output transistor circuit to stabilize a voltage at the first terminal for variations in the positive power supply. The second supply rejection circuit is connected to the second output transistor circuit to stabilize a voltage at the second terminal for variations in the negative power supply.

In another form of the invention, a first resistor is connected between the first terminal and the first output transistor circuits, and a second transistor is connected between the second terminal and the second output transistor circuit. The first resistor has a resistance equal to a resistance of the second resistor and greater than a resistance of the MR head. Thus, the MR head is biased near ground potential and symmetrically around ground.

BRIEF DESCRIPTION OF THE DRAWINGS

The sole FIGURE is a schematic diagram of a preamplifier circuit according to the present invention.

DETAILED DESCRIPTION OF THE PREFERRED EMBODIMENTS

As shown in the drawing, a high performance open-loop MR biasing circuit 10 according to the present invention comprises a plurality of channels each comprising a positive channel select circuit 14, a negative channel select circuit 16, a positive supply rejection circuit 18, a negative supply rejection circuit 20, and a complementary transistor circuit 22. A shared bias circuit 12 is connected via current buses 24 and 26 to all positive channel select circuits 14 and negative channel select circuits 16, respectively, and via voltage buses 28 and 30 to all complementary transistor circuits 22. Each complementary transistor circuit 22 provides bias currents to the respective MR head connected between terminals 32 and 34. The signal at the MR element $R_{MR}$ is amplified by amplifier 11 in a manner known in the art.

Shared bias circuit 12 is multiplexed to several MR head channels, and provides a positive voltage on voltage bus 28, a positive current on current bus 24, a negative voltage on voltage bus 30, and a negative current on current bus 26. Positive channel select circuitry 14 receives current from current bus 24 and in response to a channel select signal 15 provides a bias current to the selected MR head channel. Negative channel select circuitry 16 receives current from current bus 26 and in response to a channel select signal 17 provides a current opposite that provided by positive channel select circuitry 14 to the selected MR head channel. Positive supply rejection circuitry 18 operates to ensure that current through the selected MR head is not affected by fluctuations in the positive power supply $V_{CC}$. Negative supply rejection circuitry 20 operates to ensure that current through the selected MR head is not affected by fluctuations in the negative power supply $V_{EE}$. Complementary transistor circuit 22 receives positive and negative voltages from voltage buses 28 and 30, respectively, and receives current from positive channel select circuit 14 and negative channel select circuit 16 (when the MR head channel is selected). Complementary transistor circuit 22 provides a low noise bias current through the selected MR head. Complementary transistor circuit 22 and shared bias circuit 12 are each arranged symmetrically around ground. Positive channel select circuit 14 is symmetrical around ground to negative channel select circuit 16. Positive supply rejection circuit 18 is symmetrical around ground to negative supply rejection circuit 20. In this way, the impedance at each of the terminals 32 and 34 of the MR element $R_{MR}$ is equal, ensuring a high common mode rejection ratio.

In operation, shared bias circuit 12 provides a predetermined positive voltage at the base of transistor Q1 and on positive voltage bus 28, and a predetermined negative voltage, equal in amplitude and opposite in polarity to the predetermined positive voltage, at the base of transistor Q2 and on negative voltage bus 30. This is accomplished by voltage dividing resistors R1 and R2 connected between the bases of transistors Q1 and Q2, with ground connected between resistors R1 and R2, and current sources I1 and I2 connected between a positive and negative supply voltage, respectively, and the respective bases of transistors Q1 and Q2. Thus, the predetermined voltage at the base of transistor Q1 is I1–R1, and the predetermined voltage at the base of transistor Q2 is —I2·R2. Values are chosen so that I1=I2 and R1=R2, thus providing voltages at the bases of transistors Q1 and Q2 that are symmetrical around ground to each other, having equal amplitudes and opposite polarities. Bypass capacitor C1 diverts any noise signals associated with current sources I1 and I2, so that the differential voltages at the bases of transistors Q1 and Q2 have essentially low noise values. Current is provided to positive and negative sides of the preamplifier circuit (specifically to positive channel select circuit 14 and negative channel select circuit 16) on positive current bus 24 and negative current bus 26 through the operation of transistors Q1 and Q2 and resistors R3 and R4, in response to the voltages provided at the bases of transistors Q1 and Q2. Resistors R3 and R4 are preferably connected in series between the emitters of transistors Q1 and Q2, rather than simply connecting a single resistor there, to provide a node between resistors R3 and R4 for testing the operation and balance of the circuit 12 during the manufacturing process.

Positive channel select circuit 14 receives current from current bus 24 at the emitter of transistor Q3. The MR head channel in which positive channel select circuit 14 resides is selected by providing an active positive channel select signal at terminal 15. Other non-selected channels will have inactive positive channel select signals. When the channel select signal 15 is high, transistor Q3 is turned on. Current flows through transistor Q3 and is mirrored by transistors Q5 and Q6 configured as a current mirror, wherein their bases are tied together, their emitters are both connected to a positive voltage supply, and the collector of transistor Q5 is connected to its base. The output of the current mirror at the collector of transistor Q6 provides current to the complementary transistor circuit 22 associated with the selected MR head.

Negative channel select circuit 16 operates in a manner identical to the operation of positive channel select circuit 14 to provide an opposite current. Negative channel select circuit 16 receives current from current bus 26 at the emitter of transistor Q4. The MR head channel in which negative channel select circuit 16 resides is selected by providing an active negative channel select signal at terminal 17. Other non-selected channels will have inactive negative channel select signals. When the channel select signal 17 is low, transistor Q4 is turned on. Current flows through transistor Q4 and is mirrored by transistors Q9 and Q10 configured as a current mirror, wherein their bases are tied together, their emitters are both connected to a negative voltage supply, and the collector of transistor Q9 is connected to its base. The output of the current mirror at the collector of transistor Q10 provides current to the complementary transistor circuit 22 associated with the selected MR head.

Complementary transistor circuit 22 receives current from the selected positive channel select circuit 14 at the emitter of transistor Q7, and receives current from the selected negative channel select circuit 16 at the emitter of transistor Q8. The emitter of transistor Q7 is connected to the base of transistor Q11, and the emitter of transistor Q8 is connected to the base of transistor Q12. The base of transistor Q7 is connected to the positive voltage supplied from bias circuit 12 on voltage bus 28, and the base of transistor Q8 is connected to the negative voltage supplied from bias circuit 12 on voltage bus 30. The collectors of transistors Q7 and Q8 are both connected to ground. Transistor Q7 is matched with transistor Q12, and transistor Q8 is matched with transistor Q11. Thus, complementary transistor circuit 22 essentially comprises a first complementary circuit (complementary transistors Q7 and Q11) and a second complementary circuit (complementary transistors Q8 and Q12), arranged symmetrically around ground to each other.

In this configuration, the voltage on bus 28 is equal to the voltage at the emitter of transistor Q11. Similarly, the voltage on bus 30 and the voltage at the emitter of transistor Q12 are equal. The diode drops across transistors Q8 and Q11 are equal, and the diode drops across transistors Q7 and Q12 are also equal, since the transistor pairs are matched. Therefore, the positive output voltage of the complementary transistor circuit 22 is equal to the positive voltage supplied on voltage bus 28 (I1·R1), which is a low noise voltage. Similarly, the negative output voltage of the complementary transistor circuit 22 is equal to the negative voltage supplied on voltage bus 30 (—I2·R2), which is also a low noise voltage. The current through the MR element $R_{MR}$ (and resistors R5 and R6 flanking $R_{MR}$ in series) is established by the positive and negative output voltages of the complementary transistor circuit 22, and is equal to the voltage difference between the two outputs of the complementary transistor circuit 22 divided by the total series resistance. Thus, $$I_{MR} = \frac{(I1 \cdot R1) - (-I2 \cdot R2)}{R5 + R_{MR} + R6}.$$

Resistors R5 and R6 are preferably selected to have values significantly greater than the resistance of $R_{MR}$, to minimize the signal attenuation. The voltages output from the complementary transistor circuit are symmetrical around ground, and therefore provide a high common mode rejection ratio at the terminals 32 and 34 of $R_{MR}$. Also, since the entire circuit arrangement is symmetrical around ground, the impedance at each of the terminals 32 and 34 of $R_{MR}$ is equal, providing optimal common mode rejection.

The complementary transistor circuit 22 is isolated from power supply fluctuations by positive supply rejection circuitry 18 and negative supply rejection circuitry 20. Positive supply rejection circuitry 20 operates to bias the collector of transistor Q11 to a voltage equal to the voltage at the base of transistor Q11. This is achieved by connecting the base of transistor Q14 to the base of transistor Q11, and connecting the emitter of transistor Q13 to the collector of transistor Q11, and further connecting the base of transistor Q13 to the emitter of transistor Q14. The collector of transistor Q14 is connected to ground, and the collector of transistor Q13 is connected to the positive power supply $V_{CC}$. Current source 13 is connected between the base of transistor Q13 and the positive power supply $V_{CC}$. The voltage at the emitter of transistor Q14 is a diode drop above the base of transistor Q11 and a diode drop above the emitter of transistor Q13, which is connected to the collector of transistor Q11. Since the diode drops across transistors Q14 and Q13 are equal, the voltage at the collector of transistor Q11 is equal to the voltage at the base of transistor Q11. This arrangement ensures that the current from the emitter of transistor Q11 is unaffected by potential fluctuations in the positive power supply $V_{CC}$. The capacitive coupling between transistor Q11 and the positive power supply $V_{CC}$ is near zero at all frequencies, because the voltage across the base-collector capacitance of transistor Q11 is maintained at zero. Thus, positive supply rejection circuit 18 provides a high power supply rejection ratio at terminal 32 of the MR element $R_{MR}$.

Similarly, negative supply rejection circuitry 20 operates to bias the collector of transistor Q12 to a voltage equal to the voltage at the base of transistor Q12. This is achieved by connecting the base of transistor Q15 to the base of transistor Q12, and connecting the emitter of transistor Q16 to the collector of transistor Q12, and further connecting the base of transistor Q16 to the emitter of transistor Q15. The collector of transistor Q15 is connected to ground, and the collector of transistor Q16 is connected to the negative power supply $V_{EE}$. Current source I4 is connected between the base of transistor Q16 and the negative power supply $V_{EE}$. The voltage at the emitter of transistor Q15 is a diode drop below the base of transistor Q12 and a diode drop below the emitter of transistor Q16, which is connected to the collector of transistor Q12. Since the diode drops across transistors Q15 and Q16 are equal, the voltage at the collector of transistor Q12 is equal to the voltage at the base of transistor Q12. This arrangement ensures that the current from the emitter of transistor Q12 is unaffected by potential fluctuations in the negative power supply $V_{CC}$. The capacitive coupling between transistor Q12 and the negative power supply $V_{CC}$ is near zero at all frequencies, because the voltage across the base-collector capacitance of transistor Q12 is maintained at zero. Thus, negative supply rejection circuit 20 provides a high power supply rejection ratio at terminal 34 of the MR element $R_{MR}$.

The high performance open-loop MR biasing circuit 10 therefore allows sharing of a main bias circuit 12 which provides low noise currents and voltages to current and voltage buses of the preamplifier for a selected MR head, to provide a high common mode rejection ratio at the terminals of the MR head, and to provide a high power supply rejection ratio at the terminals of the MR head. Implementation of the present invention allows significant sharing of components, reducing the amount of head room occupied by the preamplifier circuitry in each channel, while also providing superior performance characteristics.

Although the present invention has been described with reference to preferred embodiments, workers skilled in the art will recognize that changes may be made in form and detail without departing from the spirit and scope of the invention.

What is claimed is:

1. A system for reading information stored on a plurality of disk surfaces, the system comprising a plurality of channels each containing a preamplifier having first and second terminals for connection to an MR head associated with a respective disk surface, the preamplifier providing a bias current to the respective MR head, a supply circuit symmetrically arranged around ground to provide first and second voltages having equal amplitudes and opposite polarities, the preamplifier in each channel comprising:

a first channel select circuit responsive to a first channel select signal;

a second channel select circuit, arranged symmetrically around ground to the first channel select circuit, responsive to a second channel select signal; and first and second complementary output transistor circuits, the second output transistor circuit being symmetrical around ground to the first output transistor circuit, the first output transistor circuit being responsive to the first channel select circuit and the first voltage to provide a first bias current to the respective first terminal, the second output transistor being responsive to the second channel select circuit and the second voltage to provide a second bias current to the respective second terminal, the first and second bias currents being based on the first and second voltages.

2. The preamplifier of claim 1 comprising first and second supply rejection circuits, the second power supply rejection circuit being symmetrical around ground to the first power supply rejection circuit, the first supply rejection circuit being connected to the first output transistor circuit to stabilize a current at the first terminal for variations in the positive power supply and the second supply rejection circuit being connected to the second output transistor circuit to stabilize a current at the second terminal for variations in the negative power supply.

3. The preamplifier of claim 2 wherein the first supply rejection circuit comprises:

a first PNP transistor having a base connected to the first output transistor circuit and a collector connected to ground;

a first NPN transistor having a base connected to an emitter of the first PNP transistor, an emitter connected to the first output transistor circuit, and a collector connected to the positive power supply; and a first current source connected between the base of the first NPN transistor and the positive power supply;

and wherein the second supply rejection circuit comprises:

a second NPN transistor having a base connected to the second output transistor circuit and a collector connected to ground;

a second PNP transistor having a base connected to an emitter of the second NPN transistor, an emitter connected to the second output transistor circuit, and a collector connected to the negative power supply; and a second current source connected between the base of the second PNP transistor and the negative power supply.

4. The preamplifier of claim 3 wherein the first output transistor circuit comprises:

an input PNP transistor having a base connected to the supply circuit to receive the first voltage, an emitter connected to the first channel select circuit, and a collector connected to ground; and an output NPN transistor having a base connected to the emitter of the input PNP transistor, an emitter coupled to the first terminal to output a voltage equal to the first voltage, and a collector connected to the emitter of the first NPN transistor, the base of the first PNP transistor being connected to the base of the output NPN transistor;

and wherein the second output transistor circuit comprises:

an input NPN transistor matched to the output NPN transistor and having a base connected to the supply circuit to receive the second voltage, an emitter connected to the second channel select circuit, and a collector connected to ground;

an output PNP transistor matched to the input PNP transistor and having a base connected to the emitter of the input NPN transistor, an emitter coupled to the second terminal to output a voltage equal to the second voltage, and a collector connected to the emitter of the second PNP transistor, the base of the second NPN transistor being connected to the base of the output PNP transistor.

5. The preamplifier of claim 4 including a first resistor connected between the first terminal and the emitter of the output NPN transistor and a second resistor connected between the second terminal and the emitter of the output PNP transistor, the first resistor having a resistance equal to a resistance of the second resistor and greater than a resistance of the MR head, whereby the MR head is biased near ground potential and symmetrically around ground.

6. The preamplifier of claim 1 wherein the first output transistor circuit comprises:

an input PNP transistor having a base connected to the supply circuit to receive the first voltage, an emitter connected to the first channel select circuit, and a collector connected to ground; and an output NPN transistor having a base connected to the emitter of the input PNP transistor, an emitter coupled to the first terminal to output a voltage equal to the first voltage, and a collector coupled to the positive power supply;

and wherein the second output transistor circuit comprises:

an input NPN transistor matched to the output NPN transistor and having a base connected to the supply circuit to receive the second voltage, an emitter connected to the second channel select circuit, and a collector connected to ground;

an output PNP transistor matched to the input PNP transistor and having a base connected to the emitter of the input NPN transistor, an emitter coupled to the second terminal to output a voltage equal to the second voltage, and a collector coupled to the negative power supply.

7. The preamplifier of claim 6 including a first resistor connected between the first terminal and the emitter of the output NPN transistor and a second resistor connected between the second terminal and the emitter of the output PNP transistor, the first resistor having a resistance equal to a resistance of the second resistor and greater than a resistance of the MR head, whereby the MR head is biased near ground potential and symmetrically around ground.

8. A system for reading information stored on a disk surface, the system including first and second terminals for connection to an MR head associated with the disk surface, means for connection to positive and negative power supplies, and a preamplifing circuit comprising:

a supply circuit providing first and second voltages having equal amplitudes and opposite polarities, the first and second voltages being symmetrical around ground;

first and second complementary output transistor circuits, the second output transistor circuit being symmetrical around ground to the first output transistor circuit, the first output transistor circuit being responsive to the first voltage to provide a first bias current to the first terminal, the second output transistor circuit being responsive to the second voltage to provide a second bias current to the second terminal, the first and second bias currents being based on the first and second voltages.

9. The preamplifying circuit of claim 8 wherein the supply circuit further provides first and second currents having equal magnitudes and opposite directions, the first and second currents being symmetrical around ground, and the first output transistor circuit comprises:

an input PNP transistor having a base connected to the supply circuit to receive the first voltage, an emitter connected to receive the first current, and a collector connected to ground; and an output NPN transistor having a base connected to the emitter of the input PNP transistor, an emitter coupled to the first terminal to output a voltage equal to the first voltage, and a collector coupled to the positive power supply;

and wherein the second output transistor circuit comprises:

an input NPN transistor matched to the output NPN transistor and having a base connected to the supply circuit to receive the second voltage, an emitter connected to receive the second current, and a collector connected to ground; and an output PNP transistor matched to the input PNP transistor and having a base connected to the emitter of the input NPN transistor, an emitter coupled to the second terminal to output a voltage equal to the second voltage, and a collector coupled to the negative power supply.

10. The preamplifying circuit of claim 9 including a first resistor connected between the first terminal and the emitter of the output NPN transistor and a second resistor connected between the second terminal and the emitter of the output PNP transistor, the first resistor having a resistance equal to a resistance of the second resistor and greater than a resistance of the MR head, whereby the MR head is biased near ground potential and symmetrically around ground.

11. The circuit of claim 8 including first and second supply rejection circuits, the second supply rejection circuit being symmetrical around ground to the first supply rejection circuit, the first supply rejection circuit being connected to the first output transistor circuit to stabilize the first bias current at the first terminal for variations in the positive power supply and the second supply rejection circuit being connected to the second output transistor circuit to stabilize the second bias current at the second terminal for variations in the negative power supply.

12. The circuit of claim 8 including a plurality of channels, each channel including respective first and second output transistor circuits for connection to a respective MR head, the supply circuit comprising:

a first voltage source for supplying the first voltage, a first voltage bus connected between the first voltage source and each of the first output transistor circuits to supply the first voltage to each first output transistor circuit, a second voltage source for supplying the second voltage, and a second voltage bus connected between the second voltage source and each of the second output transistor circuits to supply the second voltage to each second output transistor circuit.

13. A circuit for deriving a bias current for a plurality of channels, each channel including first and second terminals for connection to a respective MR head, the circuit comprising:

a first voltage bus connected to each of the channels to supply a first voltage to each channel, and a second voltage bus connected to each of the channels to supply a second voltage to each channel, the first and second voltages having equal amplitudes and opposite polarities; and each channel including a first resistor connected between the first voltage bus and the respective first terminal to provide a first current, and a second resistor connected between the second voltage bus and the respective second terminal to provide a second current, the first and second currents having equal magnitudes and opposite directions so that the first and second currents flow through the MR head in the same direction.

14. The circuit of claim 13 including a capacitor coupled between the first and second voltage buses.

15. The circuit of claim 14 including means for connecting the circuit to positive and negative power supplies, and wherein each channel further includes:

a first output transistor circuit between the first voltage bus and a respective first resistor;

a second output transistor circuit between the second voltage bus and a respective second resistor: and a first and a second supply rejection circuit, the second supply rejection circuit being symmetrical around ground to the first supply rejection circuit, the first supply rejection circuit being connected to the first output transistor circuit to stabilize a current at a respective first terminal for variations in the positive power supply and the second supply rejection circuit being connected to the second output transistor circuit to stabilize a current at a respective second terminal for variations in the negative power supply.

16. The circuit of claim 15 wherein each of the plurality of first supply rejection circuits comprises:

a first PNP transistor having a base connected to the respective first output transistor circuit and a collector connected to ground;

a first NPN transistor having a base connected to an emitter of the first PNP transistor, an emitter connected to the respective first output transistor circuit, and a collector connected to the positive power supply; and a first supply rejection current source connected between the base of the first NPN transistor and the positive power supply;

and wherein each of the plurality of second supply rejection circuits comprises:

a second NPN transistor having a base connected to the respective second output transistor circuit and a collector connected to ground;

a second PNP transistor having a base connected to an emitter of the second NPN transistor, an emitter connected to the respective second output transistor circuit, and a collector connected to the negative power supply; and a second supply rejection current source connected between the base of the second PNP transistor and the negative power supply.

17. The circuit of claim 13 including a first voltage source supplying the first voltage and a second voltage source supplying the second voltage, the first and second voltages being symmetrical around ground.

18. The circuit of claim 17 including means for connecting the circuit to positive and negative power supplies, and wherein the first and second voltage sources comprise:

a first current source connected to the positive power supply;

a second current source connected to the negative power supply;

a third resistor connected between the first current source and ground; and a fourth resistor connected between the second current source and ground.

19. The circuit of claim 18 including a capacitor coupled between the first and second current sources.

20. The circuit of claim 19 wherein the circuit further comprises first and second current buses connected to each of the channels to supply first and second currents to each channel, the first and second currents having equal magnitudes and opposite directions, and each channel includes a first and a second channel select circuit for the respective MR head, each first channel select circuit comprising:

a first terminal for receiving a first channel select signal;

a first select transistor having a base connected to the first terminal and having an emitter connected to the first current bus;

a first mirror transistor having a collector and a base each connected to the collector of the first select transistor, and having an emitter connected to the positive power supply; and a second mirror transistor having a base connected to the base of the first mirror transistor, an emitter connected to the positive power supply, and a collector connected to an output circuit in the respective channel;

and wherein each second channel select circuit comprises:

a second terminal for receiving a second channel select signal;

a second select transistor having a base connected to the second terminal and having an emitter connected to the second current bus;

a third mirror transistor having a collector and a base each connected to the collector of the second select transistor, and having an emitter connected to the negative power supply; and a fourth mirror transistor having a base connected to the base of the third mirror transistor, an emitter connected to the negative power supply, and a collector connected to an output circuit in the respective channel.

21. The circuit of claim 20 wherein each channel includes a first complementary transistor circuit having:

an input PNP transistor having a base connected to the first voltage bus to receive the first voltage, an emitter connected to the respective first channel select circuit to receive an output current therefrom, and a collector connected to ground; and an output NPN transistor having a base connected to the emitter of the input PNP transistor, an emitter connected to the respective first resistor to output a voltage equal to the first voltage, and a collector coupled to the positive power supply;

and a second complementary transistor circuit having:

an input NPN transistor matched to the output NPN transistor and having a base connected to the second voltage bus to receive the second voltage, an emitter connected to the respective second channel select circuit to receive an output current therefrom, and a collector connected to ground; and an output PNP transistor matched to the input PNP transistor and having a base connected to the emitter of the input NPN transistor, an emitter connected to the respective second resistor to output a voltage equal to the second voltage, and a collector coupled to the negative power supply.

22. The circuit of claim 18 wherein each channel includes a first complementary transistor circuit including a first transistor having a base, collector and emitter, the base of the first transistor being connected to the first voltage bus and the collector of the first transistor being connected to ground, and a second transistor having a base, collector and emitter, the base of the second transistor being connected to the emitter of the first transistor, the collector of the second transistor being connected to the means for connection to the positive power supply, and the emitter of the second transistor being connected to the first resistor; and a second complementary transistor circuit including a third transistor having a base, collector and emitter, the base of the third transistor being connected to the second voltage bus and the collector of the third transistor being connected to ground, and a fourth transistor having a base, collector and emitter, the base of the fourth transistor being connected to the emitter of the third transistor, the collector of the fourth transistor being connected to the means for connection to the negative power supply, and the emitter of the fourth transistor being connected to the second resistor.

23. The circuit of claim 13 wherein the first resistor has a resistance equal to a resistance of the second resistor and greater than a resistance of the MR head, whereby the respective MR head is biased near ground potential and symmetrically around ground.

24. The circuit of claim 13 further including:

a first channel select circuit responsive to a first channel select signal to supply the respective first current to the first terminal; and a second channel select circuit responsive to a second channel select signal to supply the respective second current to the second terminal.

25. The circuit of claim 24 including means for connecting the circuit to positive and negative power supplies, each channel of the circuit further comprising:

a first output transistor circuit between the first voltage bus and a respective first resistor;

a second output transistor circuit between the second voltage bus and a respective second resistor, and first and second supply rejection circuits, the second supply rejection circuit being symmetrical around ground to the first supply rejection circuit, the first supply rejection circuit being connected to the first output transistor circuit to stabilize a current at the respective first terminal for variations in the positive power supply and the second supply rejection circuit being connected to the second output transistor circuit to stabilize a current at the respective second terminal for variations in the negative power supply.

26. The preamplifyiing circuit of claim 24 wherein the first supply rejection circuit comprises:

a first PNP transistor having a base connected to the first output transistor circuit and a collector connected to ground;

a first NPN transistor having a base connected to an emitter of the first PNP transistor, an emitter connected to the first output transistor circuit, and a collector connected to the positive power supply; and a first current source connected between the base of the first NPN transistor and the positive power supply;

and wherein the second supply rejection circuit comprises:

a second NPN transistor having a base connected to the second output transistor circuit and a collector connected to ground;

a second PNP transistor having a base connected to an emitter of the second NPN transistor, an emitter connected to the second output transistor circuit, and a collector connected to the negative power supply; and a second current source connected between the base of the second PNP transistor and the negative power supply.

27. The preamplifying circuit of claim 26 wherein the circuit further provides first and second supply currents having equal magnitudes and opposite directions, the first and second supply currents being symmetrical around ground, and the first output transistor circuit comprises:

an input PNP transistor having a base connected to the first voltage bus to receive the first voltage, an emitter connected to the first channel select circuit to receive the first supply current, and a collector connected to ground;

an output NPN transistor having a base connected to the emitter of the input PNP transistor, an emitter coupled to the first terminal to output a voltage equal to the first voltage, and a collector connected to the emitter of the first NPN transistor, the base of the first PNP transistor being connected to the base of the output NPN transistor;

and wherein the second output transistor circuit comprises:

an input NPN transistor matched to the output NPN transistor and having a base connected to the second voltage bus to receive the second voltage, an emitter connected to the second channel select circuit to receive the second supply current, and a collector connected to ground; and an output PNP transistor matched to the input PNP transistor and having a base connected to the emitter of the input NPN transistor, an emitter coupled to the second terminal to output a voltage equal to the second voltage, and a collector connected to the emitter of the second PNP transistor, the base of the second NPN transistor being connected to the base of the output PNP transistor.

28. The preamplifying circuit of claim 27 including a first resistor connected between the first terminal and the emitter of the output-NPN transistor and a second resistor connected between the second terminal and the emitter of the output PNP transistor, the first resistor having a resistance equal to a resistance of the second resistor and greater than a resistance of the MR head, whereby the MR head is biased near ground potential and symmetrically around ground.

29. The circuit of claim 23 including first and second voltage sources supplying the first and second voltages and means for connecting the circuit to positive and negative power supplies, the first and second voltage sources comprising:

a first current source connected between the positive power supply and the first voltage bus;

a third resistor connected between the first voltage bus and a reference voltage to establish the first voltage on the first voltage bus;

a second current source connected between the negative power supply and the second voltage bus;

a fourth resistor connected between the second voltage bus and the reference voltage to establish the second voltage on the second voltage bus; and a capacitor connected between the first and second voltage buses.

30. The circuit of claim 29 wherein the reference voltage is ground.

31. The circuit of claim 23 including:

a first bias transistor having a base connected to the first voltage bus and a collector connected to a first current bus;

a second bias transistor having a base connected to the second voltage bus and a collector connected to a second current bus; and a third resistor connected between an emitter of the first bias transistor and an emitter of the second bias transistor.

32. The circuit of claim 31 wherein the first channel select circuit is connected to the first current bus, and the second channel select circuit is connected to the second current bus.

* * * * *

UNITED STATES PATENT AND TRADEMARK OFFICE
CERTIFICATE OF CORRECTION

PATENT NO. : 5,856,891
DATED : January 5, 1999
INVENTOR(S) : TUAN V. NGO

It is certified that error appears in the above-identified patent and that said Letters Patent is hereby corrected as shown below:

Col. 1, line 39, after "errors", delete "considerations."

Col. 9, line 11, delete " preamplifing", insert --preamplifying--

Col. 13, line 13, delete " preamplifing", insert --preamplifying--

Col. 14, line 15, delete "output-NPN", insert --output NPN--

Signed and Sealed this

Fourth Day of May, 1999

Q. TODD DICKINSON

Attest:

Attesting Officer

Acting Commissioner of Patents and Trademarks